United States Patent [19]

Kumamoto et al.

[11] Patent Number: 5,041,884
[45] Date of Patent: Aug. 20, 1991

[54] MULTILAYER SEMICONDUCTOR INTEGRATED CIRCUIT

[75] Inventors: Toshio Kumamoto; Hiroyuki Kouno, both of Itami, Japan

[73] Assignee: Mitsubishi Denki Kabushiki Kaisha, Tokyo, Japan

[21] Appl. No.: 596,069

[22] Filed: Oct. 11, 1990

[51] Int. Cl.[5] .............................................. H01L 29/78
[52] U.S. Cl. .................................. 357/23.4; 357/23.5; 357/23.7; 357/41; 357/59; 357/68; 357/55
[58] Field of Search ..................... 357/23.4, 23.5, 23.7, 357/49, 59, 68

[56] References Cited

U.S. PATENT DOCUMENTS 4,929,988 5/1990 Yoshikawa ..................... 357/23.5

OTHER PUBLICATIONS

"A Trench Transistor Cross-Point DRAM Cell": 1985, IEDM 29.6; pp. 714–717; W. F. Richardson, etc. (Brochure).

Primary Examiner—Edward J. Wojciechowicz
Attorney, Agent, or Firm—Oblon, Spivak, McClelland, Maier & Neustadt

[57] ABSTRACT

The inventive multilayer semiconductor integrated circuit has a columnar semiconductor region provided between adjacent two layers and a control electrode provided in the vicinity of the columnar semiconductor region. The transference of a signal between the adjacent two layers is carried out through the columnar semiconductor region the electric conductivity of which is controlled by a control signal applied to the control electrode. That is, the area corresponding to the columnar semiconductor region functions as an active element.

8 Claims, 2 Drawing Sheets

MULTILAYER SEMICONDUCTOR INTEGRATED CIRCUIT

BACKGROUND OF THE INVENTION

1. Field of the Invention

The present invention relates to a multilayer semiconductor integrated circuit, and more particularly to the transfer of signal between adjacent layers of the multilayer semiconductor integrated circuit.

2. Description of the Prior Art

FIG. 3 is a sectional view showing a part of a conventional multilayer semiconductor integtrated circuit.

Referring to FIG. 3, electronic circuit regions 1 and 2 are formed to be stacked in three-dimensions through individual insulating regions 3 to 5.

The electronic circuit region 1, for example, consists of p-type semiconductor regions 6 and 7, an n-type semiconductor region 8, a gate region 9 made of polysilicon, and wiring regions 10 and 11 made of metal material. The electronic circuit region is formed on the insulating region 3 made of $SiO_2$ and covered with the insulating region 4 made of $SiO_2$.

The electronic circuit region 2, for example, consists of n-type semiconductor regions 12 and 13, a p-type semiconductor region 14, a gate region 15 made of polysilicon, and wiring regions 16 and 17 made of metal material. The electronic circuit region 2 is formed on the insulating region 4 and covered with the insulating region 5 made of $SiO_2$.

The electronic circuit region and 2 are electrically connected with each other through a conductive path 18 which is formed by making a through hole in the insulating regions 4 and 5 and thereafter embedding metal material in the through hole.

According to the multilayer semiconductor integrated circuit, the p-type semiconductor region 8 of the electronic circuit region 1 formed at a lower layer part is electrically connected with the n-type semiconductor region 13 of the electronic circuit region 2 formed at an upper layer part through the wiring regions 10 and 17 and the conductive path 18, which eventually makes it possible to transfer a signal through the conductive path 18 from the electronic circuit region 1 to the electronic circuit region 2 or vice versa.

FIG. 4 is a sectional view showing a part of another conventional multilayer integrated circuit.

Referring to FIG. 4, an electronic circuit region 2 formed at an upper layer part has p-type semiconduotor regions 19 and 20 and n-type semiconductor regions 21 and 22 for forming a thyristor, instead of the semiconductor regions 12 to 14 for forming a p-channel MOS transistor of FIG. 3. And a p-type semiconductor region 6 of an electronic circuit region 1 formed at a lower layer part is electrically connected with the p-type semiconductor region 19 of the electronic circuit region 2 through a p-type columnar semiconductor region 23. Other reference numerals than the above-mentioned designate the same parts as in FIG. 3.

According to the multilayer semiconductor integrated circuit, a signal can be transferred through the columnar semiconductor region 23 from the electronic circuit region 1 to the electronic circuit region 2 or vice versa.

The conventional multilayer semiconductor integrated circuits, however, transfer the signal between the upper layer part and the lower layer part only through the conductive path 18 by the through hole or the columnar semiconductor region 23, and therefore the conductive path 18 and the columnar semiconductor region 23 merely function as passive elements, which eventually makes a space in a semiconductor chip useless.

SUMMARY OF THE INVENTION

The present invention is directed to a multilayer semiconductor integrated circuit of which a plurality of electronic circuit region are formed to be stacked in three-dimensions through individual insulating regions.

The multilayer semiconductor integrated circuit comprises a columnar semiconductor region formed to penetrate the insulating region in order to electrically connect the adjacent electronic circuit regions with each other; and a control electrode provided in the vicinity of the columnar semiconductor region within the insulating region in order to control an electric conductivity of the columnar semiconductor region in response to a control signal applied to the control electrode.

Accordingly, a principal object of the present invention is to provide a multilayer semiconductor integrated circuit which can improve the integration thereof.

According to the present invention, since a signal is transferred between an upper layer part and a lower layer part through a columnar semiconductor region the electric conductivity of which is controlled by control signal applied to a control electrode, the area that the columnar semiconductor region is formed functions as an active element, which eventually makes it possible to improve the integration of the multilayer semiconductor integrated circuit as a whole.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
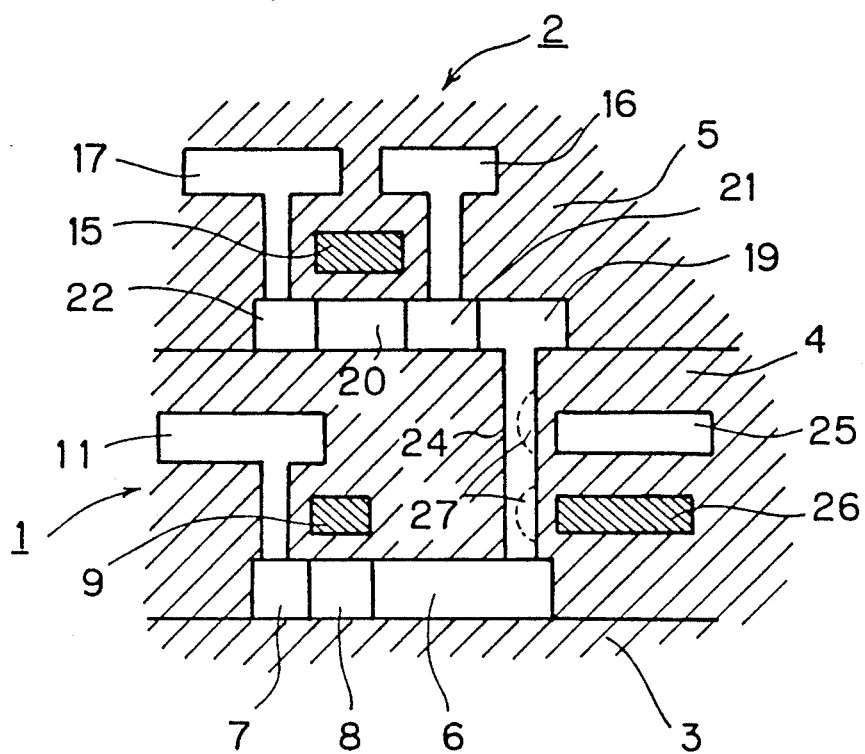
FIG. 1 is a sectional view showing an embodiment of a multilayer semiconductor integrated circuit according to the present invention.

FIG. 1 is a sectional view showing an embodiment of a multilater semiconductor integrated circuit according to the present invention.

Referring to FIG. 1, electronic circuit regions and 2 are formed to be stacked in three-dimensions through individual insulating regions 3 to 5.

The electronic circuit region for example, consists of p-type semiconductor regions 6 and 7 an n-type semiconductor region 8, a gate region 9 made of polysilicon, and a wiring region 11 made of metal material. Thus, a p-channel MOS transistor is made by the semiconductor regions 6 to 8 and the gate region 9. The electronic circuit region 1 is formed on the insulating region 3 made of SiO₂ and covered with the insulating region 4 made of SiO₂.

The electronic circuit region 2, for example, consists of p-type semiconductor regions 19 and 20, n-type semiconductor regions 21 and 22, a gate region 15 made of polysilicon, and wiring regions 16 and 17 made of metal material. Thus, an n-channel MOS transistor is made by the semiconductor regions 20 to 22 and the gate region 15. The electronic circuit region 2 is formed on the insulating region 4 and covered with the insulating regions 5 made of SiO₂.

The electronic circuit regions 1 and 2 are electrically connected with each other through a p-type columnar semiconductor region 24. In addition, gate electrode regions 25 and 26 are provided in the vicinity of the columnar semiconduotor region 24 along a longitudinal direction of the columnar semiconductor region 24 within the insulating region 4.

The columnar semiconductor region 24 may be formed by an epitaxial growth technique or may be formed by using what is called a seed which is widely known in a process for manufacturing a multilayer semiconductor device. The gate electrode region 25 is made of metal material, and is formed by the same manufacturing process as that of the wiring region 11. The other gate electrode region 26 is made of polysilicon, and is formed by the same manufacturing process as that of the gate region 9.

According to the multilayer semiconductor integrated circuit, the n-type semiconductor region 21 of the electronic circuit region 2 formed at an upper layer part is electrically connected with the p-type semiconductor region 6 of the electronic circuit region 1 formed at a lower layer part through the p-type semiconductor region 19 and the columnar semiconductor region 24. In this case, the electric conductivity of the columnar semiconductor region 24 is controlled by the control signals applied to the gate electrode regions 25 and 26. For example, when the control signals of positive voltage are applied to the gate electrode regions 25 and 26 respectively, depletion layers 27 are formed in the columnar semiconductor region 24 at the positions corresponding to the gate electrode regions 25 and 26 respectively, as shown in FIG. 1. And the size of the depletion layers 27 is adjusted by changing the value of voltage in the control signals applied to the gate electrode regions 25 and 26, which eventually makes it possible to control the electric conductivity of the columnar semiconductor region 24. That is, the columnar semiconductor region 24 functions as a junction FET in cooperation with the gate electrode regions 25 and 26, in which the electric conductivity of channel is controlled by the depletion layers 27.

The control signals to be applied to the gate electrode regions 25 and 26 may be similar to each other, or may be different from each other. In a case where the control signals are different from each other, it has the same function as two FET being connected in series.

According to the multilayer semiconductor integrated circuit, since the columnar semiconductor region 24 functions as a junction FET in cooperation with the gate electrode regions 25 and 26, it is possible to use the area corresponding to the columnar semiconductor region 24 as an active element, which eventually makes it possible to improve the integration of the multilayer semiconductor integrated circuit as a whole.

In addition, the gate electrode region 25 can be easily formed by the same manufacturing process as that of the wiring region 11 and another gate electrode region 26 can be also easily formed by the same manufacturing process as that of the gate region 9.

Figure 2:
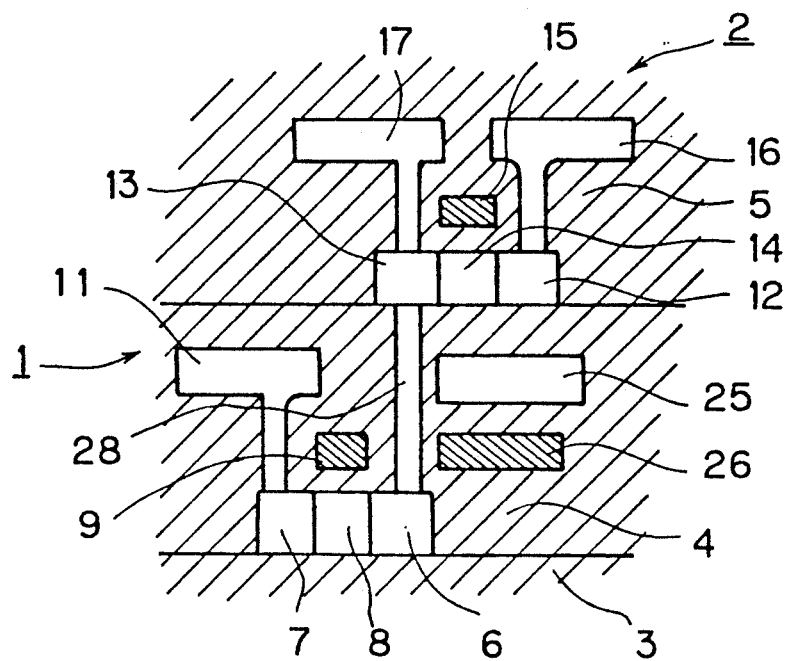
FIG. 2 is a sectional view showing another embodiment of a multilayer semiconductor integrated circuit according to the present invention.
Figure 3:
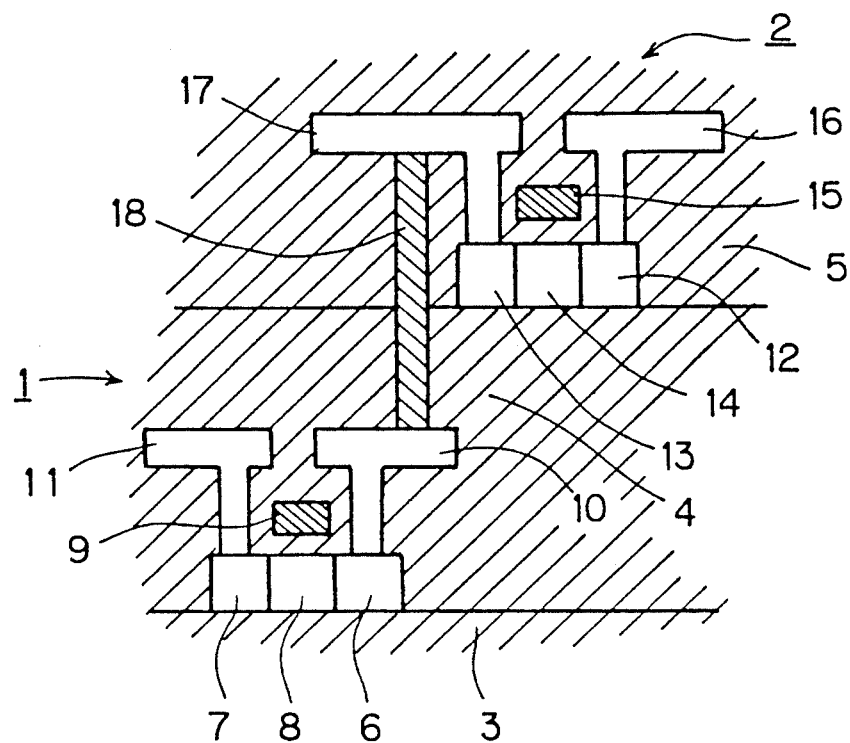
FIG. 3 is a sectional view showing a part of a conventional multilayer semiconductor integrated circuit.
Figure 4:
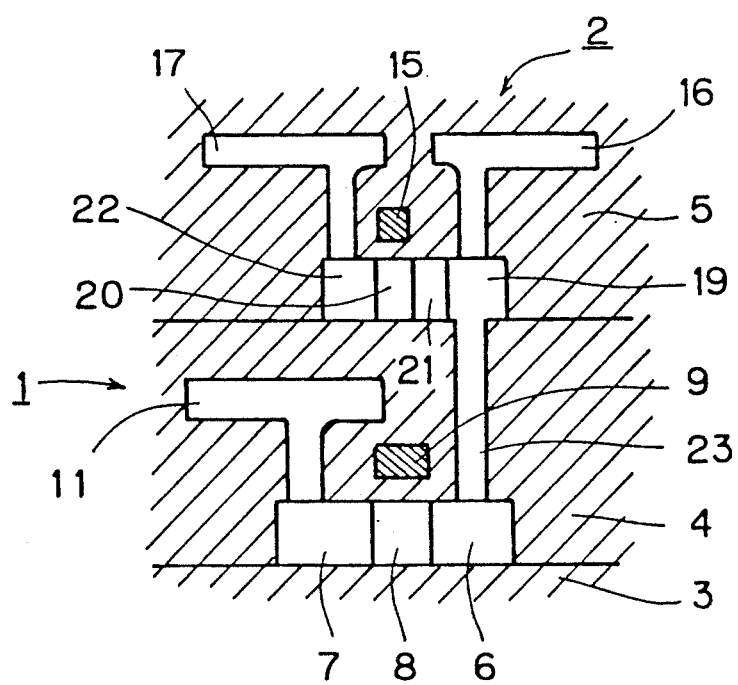
FIG. 4 is a sectional view showing a part of another conventional multilayer semiconductor integrated circuit.

FIG. 2 is a sectional view showing another embodiment of a multilayer semiconductor integrated circuit according to the present invention.

Referring to FIG. 2, an electronic circuit region 2 formed at an upper layer part has p-type semiconductor regions 12 and 13 and an n-type semiconductor region 14 for forming a p-channel MOS transistor, instead of the semiconductor regions 19 to 22 of FIG. 1. And, the p-type semiconductor region 13 of the upper layer part is electrically connected with a p-type semiconductor region 6 of an lower layer part through an n-type columnar semiconductor region 28, instead of the p-type columnar semiconductor region 24 of FIG. 1. Other reference numerals than the above-mentioned designate the same parts as in FIG. 1.

According to the multilayer semiconductor integrated circuit, the columnar semiconductor region 28 functions as an MOS transistor in cooperation with the gate electrode regions 25 and 26. That is, when control signals of negative voltage are applied to the gate eleotrode regions 25 and 26 respectively, a p-channel region is formed in the columnar semiconductor region 28 from the p-type semiconductor region 13 to the p-type semiconductor region 6, whereby the electronic circuit regions and 2 are electrically connected with each other through the p-channel region in the columnar semiconductor region 28. In this case, in order to securely form the p-channel region, it is preferable to set the thickness of the insulating region 4 between the p-type semiconductor region 13 and the gate electrode region 25, the thickness of the insulating region 4 between the gate electrode regions 25 and 26, and the thickness of the insulating region 4 between the gate electrode region 26 and the p-type semiconductor region 6 to become smaller.

According to the multilayer semiconductor integrated circuit, since the columnar semiconductor region 28 functions as an MOS FET in cooperation with the gate electrode regions 25 and 26, it is possible to use the area corresponding to the columnar semiconductor region 28 as an active element, which eventually makes it possible to improve the integration of the multilayer semiconductor integrated circuit as a whole.

In the above embodiments channel length depends on the total thickness of the gate electrode regions 25 and 26. Accordingly, it is possible to equivalently increase the channel length by increasing the number of the gate electrode regions 25 and 26.

In the above embodiments, although a control eleotrode provided in the vicinity of the columnar semiconductor region 24 or 28 is two-layer-structure consisting of the gate electrode regions 25 and 26, the control electrode may be one layer-structure or may be three or more layer-structure.

In the above embodiments, it has been described about two-layer-type semiconductor integrated circuit, but present invention is also applicable to three or more layer-type semiconductor integrated circuit. For example, in a case of n-layer-type semiconductor integrated circuit, the transference of the signal between m-layer and (m+1)-layer (where, m<n) is carried out by using a columnar semiconductor region provided between the m-layer and the (m+1)-layer and a control electrode provided in the vicinity of the columnar semiconductor region.

The present invention is also applicable to such case where the n-type and p-type conductivity in the above embodiments are replaced by each other.

In addition, electronic circuit region to be provided in each layer is not restricted to the electronic circuit regions 1 and 2 as shown in FIGS. 1 and 2, but the other electronic circuit region may be employed.

Although the present invention has been described and illustrated in detail. It is clearly understood that the same is by way of illustration and example only and is not to be taken by way of limitation. The spirit and scope of the present invention should be limited only by the terms of the appended claims.

What is claimed is:

1. A multilayer semiconductor integrated circuit of which a plurality of electronic circuit regions are formed to be stacked in three-dimensions through individual insulating regions, said multilayer semiconductor integrated circuit comprising:
   a columnar semiconductor region formed to penetrate said insulating region in order to electrically connect said adjacent electronic circuit regions with each other; and
   a control electrode provided in the vicinity of said columnar semiconductor region within said insulating region in order to control an electric conductivity of said columnar semiconductor region in response to a control signal applied to said control electrode.

2. A multilayer semiconductor integrated circuit of claim 1, wherein said adjacent electric circuit regions include first conductivity type semiconductor regions respectively, and said columnar semiconductor region of a first conductivity type is connected between said individual first conductivity type semiconductor regions of said adjacent electronic circuit regions.

3. A multilayer semiconductor integrated circuit of claim 1, wherein said adjacent electric circuit regions include first conductivity type semiconductor regions respectively, and said columnar semiconductor region of a second conductivity type is connected between said individual first conductivity type semiconductor regions of said adjacent electronic circuit regions.

4. A multilayer semiconductor integrated circuit of any of claims 1 to 3, wherein said control electrode is made of polysilicon.

5. A multilayer semiconductor integrated circuit of any of claims 1 to 3, wherein said control electrode is made of metal material.

6. A multilayer semiconductor integrated circuit of any of claims 1 to 3, wherein said control electrode consists of a plurality of control electrode regions provided along a longitudinal direction of said columnar semiconductor region.

7. A multilayer semiconductor integrated circuit of claim 6, wherein control signals different from each other are applied to said control electrode regions respectively.

8. A multilayer semiconductor integrated circuit of claim 6, wherein control signals similar to each other are applied to said control electrode regions respectively.

* * * * *